United States Patent
Qiu (10) Patent No.: US 6,491,360 B2
(45) Date of Patent: Dec. 10, 2002

(54) COMPUTER ENCLOSURE HAVING PIVOTABLE BRACKET

(75) Inventor: Xiao Hua Qiu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/747,399

(22) Filed: Dec. 22, 2000

(65) Prior Publication Data

US 2002/0079790 A1 Jun. 27, 2002

(51) Int. Cl.⁷ .............................................. A47B 96/06
(52) U.S. Cl. ................... 312/270.2; 312/223.2; 312/321.5; 361/724
(58) Field of Search ............................... 361/724, 729, 361/801, 686; 312/223.2, 257.1, 270.2, 321.5, 327, 328

(56) References Cited

U.S. PATENT DOCUMENTS

| | | | | |
|---|---|---|---|---|
| 4,909,579 A | * | 3/1990 | Liu | 312/223.2 X |
| 5,774,343 A | * | 6/1998 | Benson et al. | 361/796 |
| 6,097,591 A | * | 8/2000 | Ircha | 312/223.2 X |
| 6,099,098 A | * | 8/2000 | Leong | 312/223.2 X |
| 6,102,500 A | * | 8/2000 | Chen | 312/223.2 |
| 6,227,632 B1 | * | 5/2001 | Liu | 312/223.2 |
| 6,318,823 B1 | * | 11/2001 | Liao | 312/223.2 X |

* cited by examiner

Primary Examiner—John G. Weiss
Assistant Examiner—Michael J. Fisher
(74) Attorney, Agent, or Firm—Wei Te Chung (57) ABSTRACT

A computer enclosure (10) includes a front panel (20) and a pivotable bracket (40). The front panel defines an opening (24) for providing access to the bracket, and a pair of screw holes (30) on opposite sides of the opening respectively. A pair of first ears (26) extends from the front panel at each side of the opening. The bracket includes a front wall (42) and a pair of side walls (44) perpendicular to the front wall. A pair of second ears (48) extends from the side walls and pivotally attached to the first ears of the front panel. A pair of locating tabs (54) extends from the front wall and each tab defines a through hole (56) therein, corresponding to and engaging at the screw holes of the front panel by bolts. The bracket is thereby secured to the front panel.

14 Claims, 8 Drawing Sheets

COMPUTER ENCLOSURE HAVING PIVOTABLE BRACKET

BACHGROUND OF THE INVENION

1. Field of the Invention

The present invention relates to a computer enclosure, and more particularly to a computer enclosure having a bracket which is pivotally installed thereinto in order to maximize availability of space within the enclosure.

2. Related Art

Contemporary electronic devices are being made smaller and lighter. Nevertheless, high performance is still required. Therefore, a computer enclosure needs to be able to receive more components which can enhance the computer's performance. A bracket is generally engaged with a front panel of an enclosure, for accommodating major components such as disk drives within the enclosure.

A conventional bracket for disk drives is disclosed in Taiwan Patent Application No. 87204497. The disk drives are secured to a fixing frame. The assembly of the disk drives and the frame is attached to the bracket, with guiding grooves of the bracket engaging with the frame. Screws are then used to secure the assembly to the bracket. Unfortunately, to remove the disk drives for maintenance or repairs, a cover or side walls of the enclosure must first be removed. The operation of removal is performed while the disk drives are completely within the enclosure. Because space inside the enclosure is usually limited, other components inside the enclosure are prone to be accidentally damaged during the removal operation.

Another bracket is disclosed in Taiwan Patent Application No. 85209373. The bracket is pivotally attached to a computer enclosure. A plurality of screws is required not only between a pair of fixing plates and the bracket, but also between the bracket and the enclosure. Therefore, the procedures of assembly and disassembly are considerably inconvenient and unduly costly. Also, the fixing plates take up valuable space inside the enclosure. Furthermore, the bracket is pivoted substantially inside the enclosure, which also reduces space available for other components inside the enclosure.

An improved computer enclosure which overcomes the above-mentioned problems of the related art is strongly desired.

SUMMARY OF THE INVENTION

Accordingly, an object of the present invention is to provide a computer enclosure having a bracket which is pivotally installed thereinto and which maximizes availability of space within the enclosure.

To achieve the above object, a computer enclosure in accordance with the present invention comprises a front panel and a pivotable bracket. The front panel defines an opening for providing access to the bracket, and a pair of screw holes on opposite sides of the opening respectively. A pair of first ears extends from the front panel at each side of the opening. The bracket includes a front wall and a pair of side walls perpendicular to the front wall. A pair of second ears extends from the side walls, for pivotal attachment to the first ears of the front panel. A pair of locating tabs extends from the front wall. Each tab defines a through hole therein, for extension of a bolt therethrough to engage at the corresponding screw hole of the front panel. The bracket is thereby secured to the front panel.

Other objects, advantages and novel features of the present invention will be drawn from the following detailed embodiments of the present invention with attached drawings, in which:

DETAILED DESCRIPTION OF THE PREFERRED EMBODIMENTS

Figure 1:
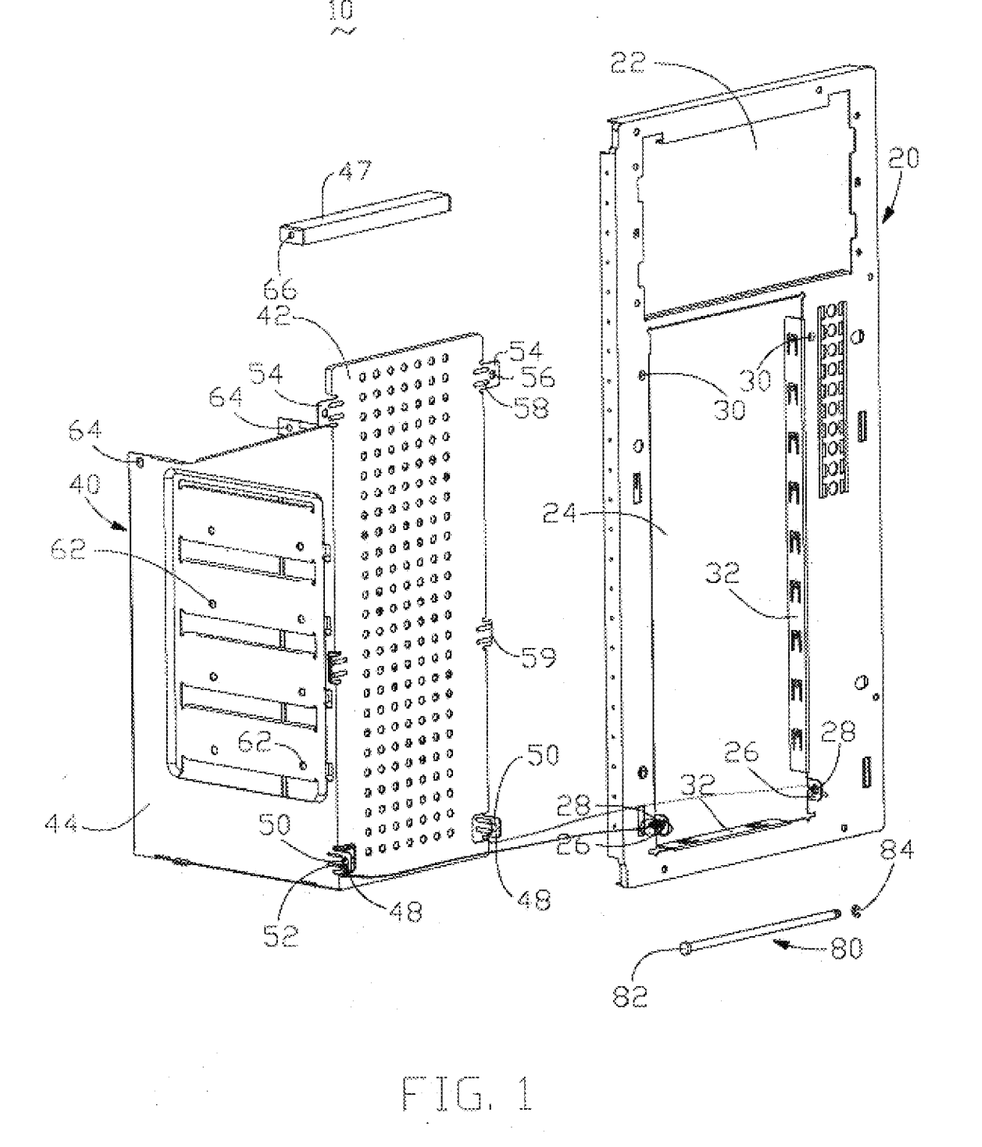
FIG. 1 is an exploded view of a computer enclosure in accordance with the present invention.
Figure 2:
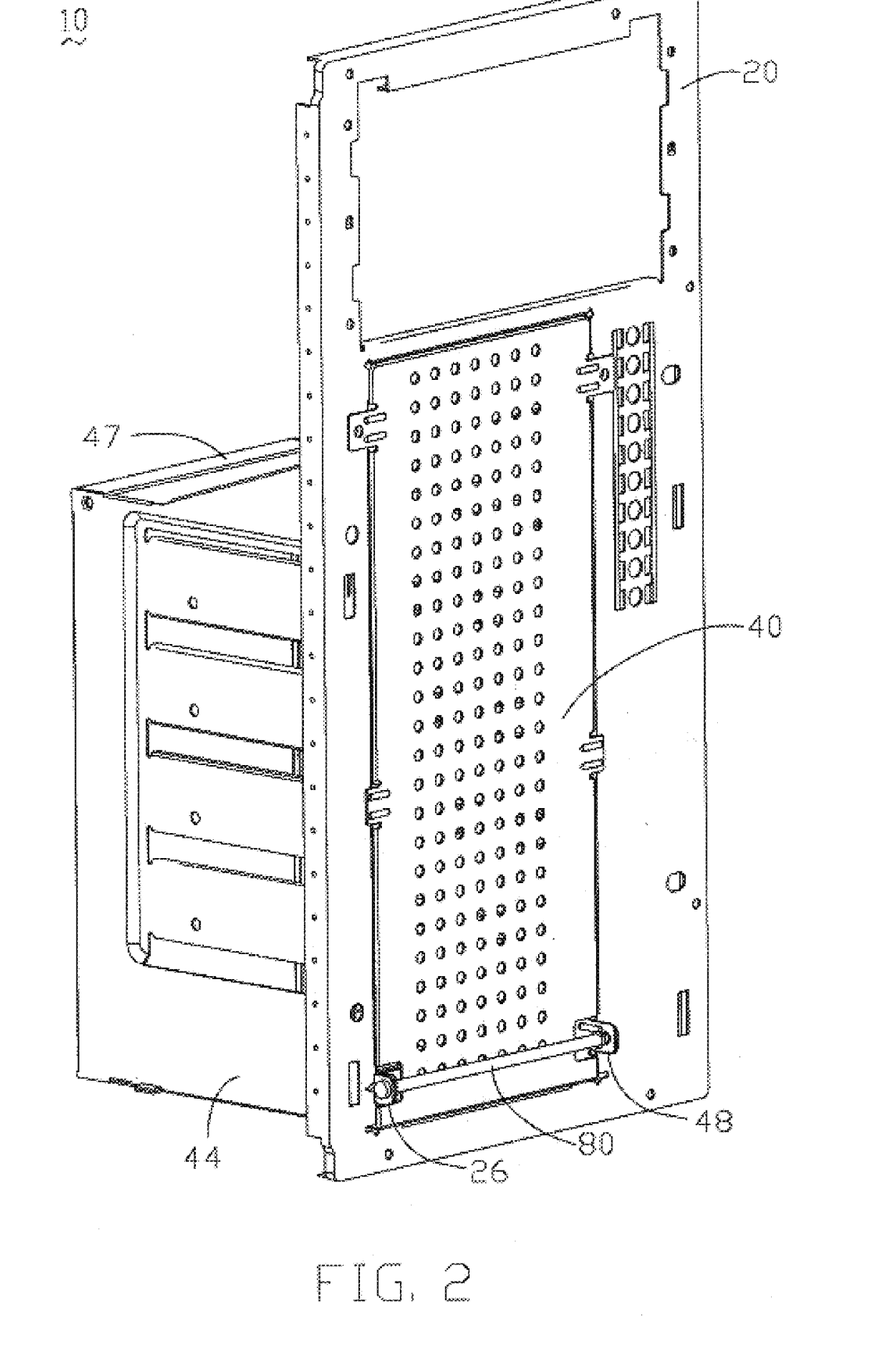
FIG. 2 is an assembled view of FIG. 1.
Figure 3:
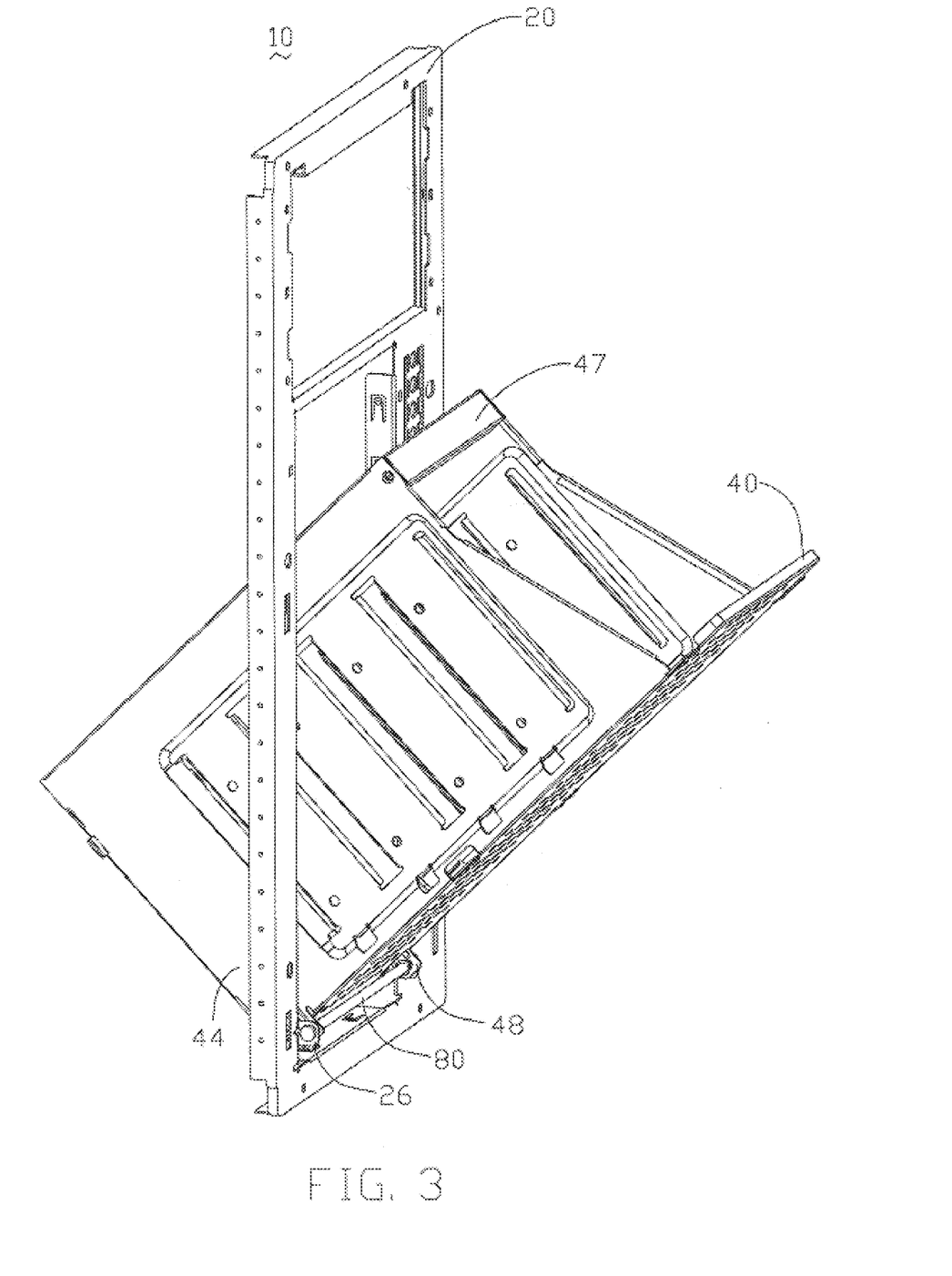
FIG. 3 is a perspective view of the enclosure of FIG. 1, showing a bracket of the enclosure being attached to a front panel of the enclosure.
Figure 4:
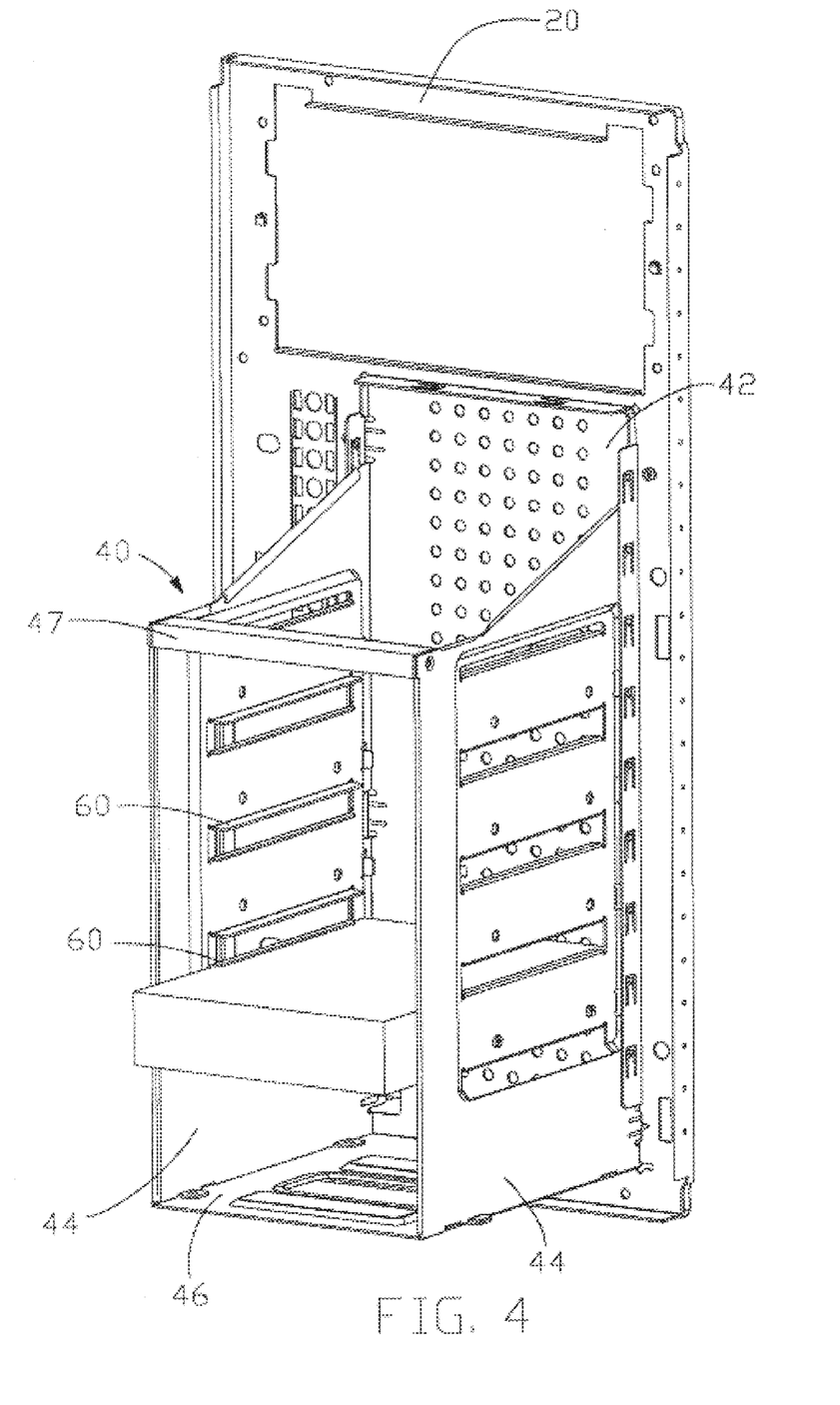
FIG. 4 is a perspective view of the enclosure of FIG. 1, with a hard disk drive (HDD) secured therein.

FIG. 1 shows a computer enclosure 10 in accordance with a preferred embodiment of the present invention. The enclosure 10 comprises a pivotable bracket 40 secured to a front panel 20. A beam 47 reinforces the bracket 40, and a pivot 80 secures the bracket 40 to the front panel 20.

The front panel 20 defines first and second openings 22, 24 therein. The first opening 22 provides access to floppy disc drives. The second opening 24 is below the first opening 22, and provides access to the bracket 40. A pair of screw holes 30 is defined in the front panel 20, on opposite sides of a top portion of the second opening 24 respectively. Three flanges 32 respectively extend perpendicularly inwardly from a bottom of the front panel 20 adjacent the second opening 24 and from opposite sides of the front panel 20 adjacent the second opening 24, for enhancing contact with the bracket 40. A pair of first ears 26 extends perpendicularly outwardly from the front panel 20, at opposite sides of a bottom portion of the second opening 24 respectively. Each first ear 26 defines a first pivot hole 28 therein.

Referring to FIGS. 1–4, the bracket 40 comprises a front wall 42, a pair of side walls 44 and a bottom wall 46. The side walls 44 extend perpendicularly inwardly from opposite side edges of the front wall 42 respectively. The bottom wall 46 extends perpendicularly inwardly from a bottom edge of the front wall 42 (see FIG. 4).

A pair of locating tabs 54 extends coplanarly from opposite sides of a top portion of the front wall 42. Each locating tab 54 defines a through hole 56 therein, corresponding to the screw hole 30 of the front panel 20. A pair of first reinforcing ribs 58 is formed on each locating tab 54, for reinforcing the locating tab 54. A pair of reinforcing tabs 59 extends coplanarly from opposite sides of a central portion of the front wall 42 respectively, for enhancing engagement of the bracket 40 with the front panel 20. A pair of second ears 48 extends perpendicularly outwardly from opposite side edges of a bottom portion of the front wall 42 respectively, coplanar with the side walls 44 and corresponding to the first ears 26 of the front panel 20. Each second ear 48 defines a second pivot hole 50 therein. The second pivot holes 50 correspond to the first pivot holes 28 of the first ears 26. A pair of second reinforcing ribs 52 is formed on each second ear 48, for reinforcing the second ear 48. The pivot 80 comprises a head 82 at an end thereof, and a fixing cap 84 for covering another end thereof.

The side walls 44 of the bracket 40 form a plurality of supporting portions 60 thereon, for supporting disk drives such as hard disk drives (HDDs). Each side wall 44 defines a plurality of apertures 62 therein between the supporting portions 60, for securing the HDDs to the bracket 40. A first orifice 64 is defined in an upper corner of each side wall 44. The beam 47 defines a second orifice 66 in a central portion of each opposite end thereof, corresponding to the first orifices 64. In pre-assembly, a pair of small bolts (not shown) is respectively inserted into the first and second orifices 64, 66 such that the beam 47 is secured between the side walls 44 to reinforce the bracket 40.

In assembly, the front wall 42 of the bracket 40 is laid down in front of the front panel 20. The HDD is secured to the bracket 40 between the supporting portions 60. The second ears 48 of the bracket 40 are engaged with the first ears 26 of the front panel 20. The second pivot holes 50 of the bracket 40 respectively oppose the corresponding first pivot holes 28 of the front panel 20. The pivot 80 is inserted into the first and second pivot holes 28, 50. The fixing cap 84 then covers the end of the pivot 80 which is opposite to the head 82. The bracket 40 is rotated upwardly around the pivot 80 and through the second opening 24 of the front panel 20, until the locating tabs 54 and the reinforcing tabs 59 of the bracket 40 abut the front panel 20. At this stage, the front wall 42 of the bracket 40 is located between the flanges 32 of the front panel 20, and the side walls 44 and the bottom wall 46 of the bracket 40 are located rearwardly of the front panel 20. The through holes 56 of the bracket 40 oppose the screw holes 30 of the front panel 20. A screw (not shown) is inserted into each mutual through hole 56 and screw hole 30. The bracket 40 is thereby secured to the front panel 20.

The enclosure 10 of the present invention has at least the following advantages:

1. The operation of securing an HDD to the bracket 40 is performed outside of the enclosure 10, thereby minimizing the risk of accidental damage being caused to other components inside the enclosure.
2. The bracket 40 rotates from outside of the front panel 20 of the enclosure 10 to inside thereof. Thus space within the enclosure 10 which is required to effect installation of the bracket 40 is no more than space to be occupied by the bracket 40 itself within the enclosure 10. Therefore, maximum space is available within the enclosure 10 for accommodating other components.

Figure 5:
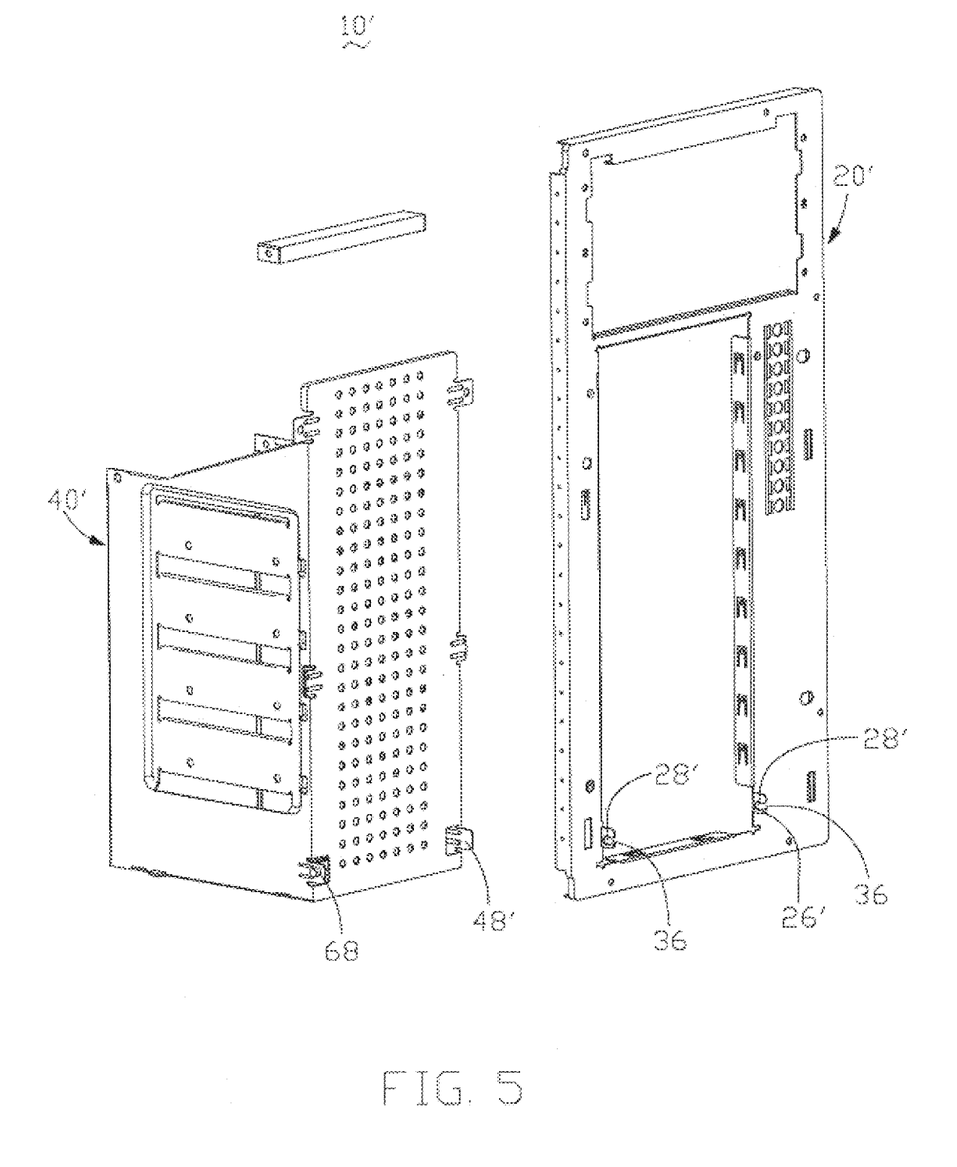
FIG. 5 is an exploded view of a computer enclosure in accordance with an alternative embodiment of the present invention.
Figure 6:
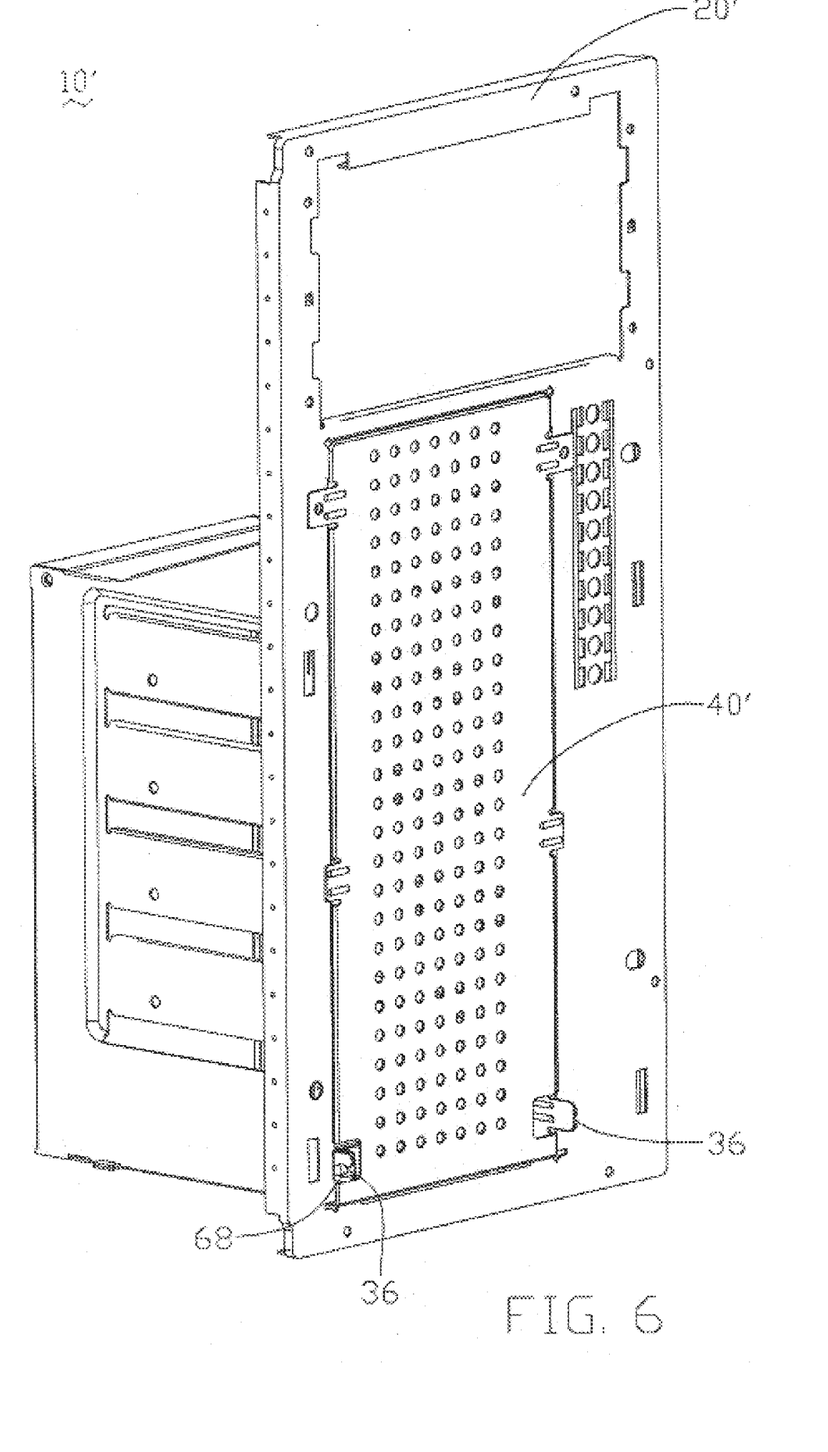
FIG. 6 is an assembled view of FIG. 5.

FIGS. 5 and 6 show a computer enclosure 10' in accordance with an alternative embodiment of the present invention. The enclosure 10' comprises a pivotable bracket 40' secured to a front panel 20'. A bracket 40' of the enclosure 10' is similar to the bracket 40 of the enclosure 10. However, an outer latch 68 is formed on each second ear 48' of the enclosure 10', in place of the second pivot hole 50 of the second ear 48 of the enclosure 10. A guideway 36 is defined in each first ear 26' of the front panel 20', in communication with a corresponding first pivot hole 28' of the first ear 26'. In assembly, the guideways 36 guide the latches 68 into the first pivot holes 28'. For brevity, further detailed description of the enclosure 10' is omitted herefrom. Instead, reference is made to the detailed description of the enclosure 10, with due alteration of details.

Figure 7:
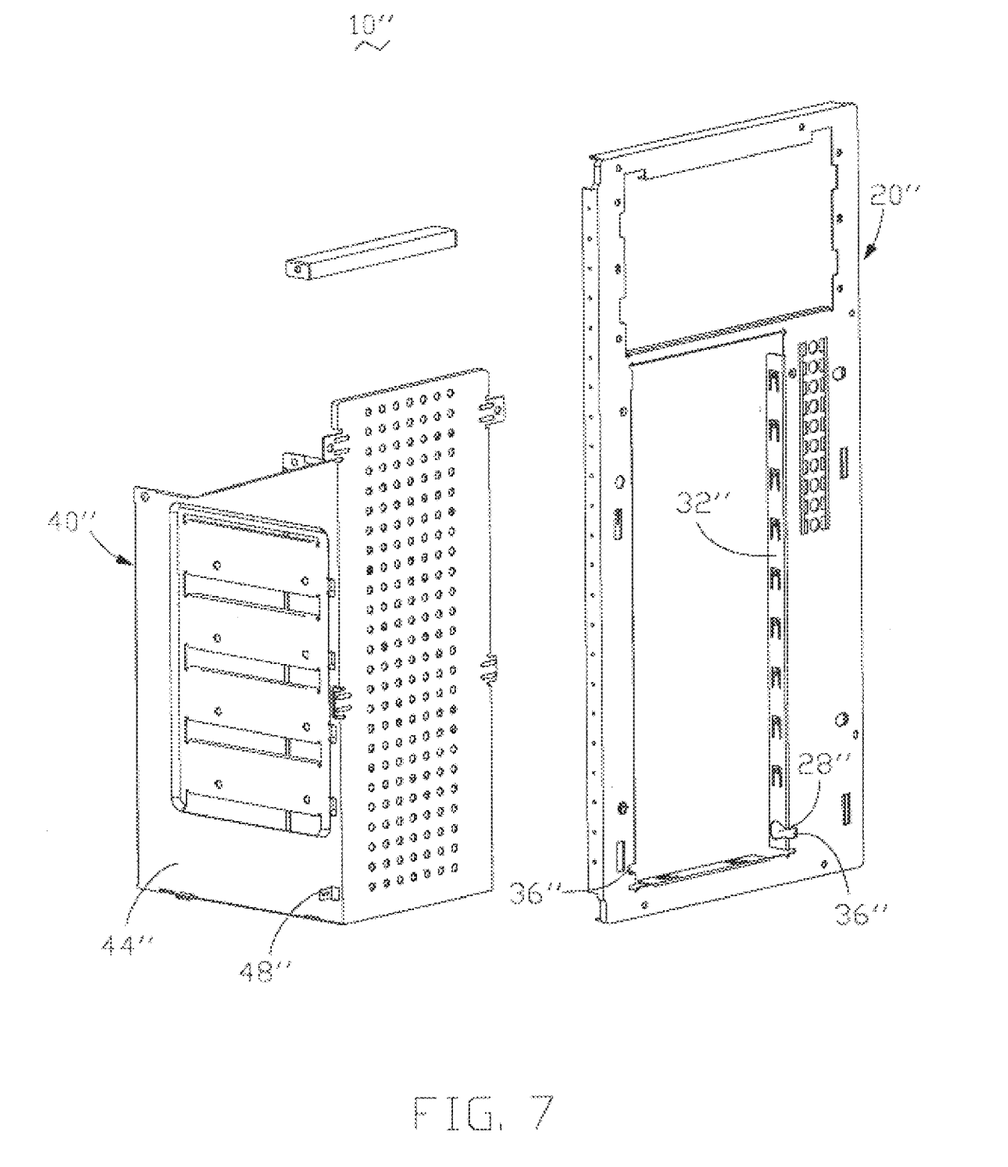
FIG. 7 is an exploded view of a computer enclosure in accordance with a further alternative embodiment of the present invention.
Figure 8:
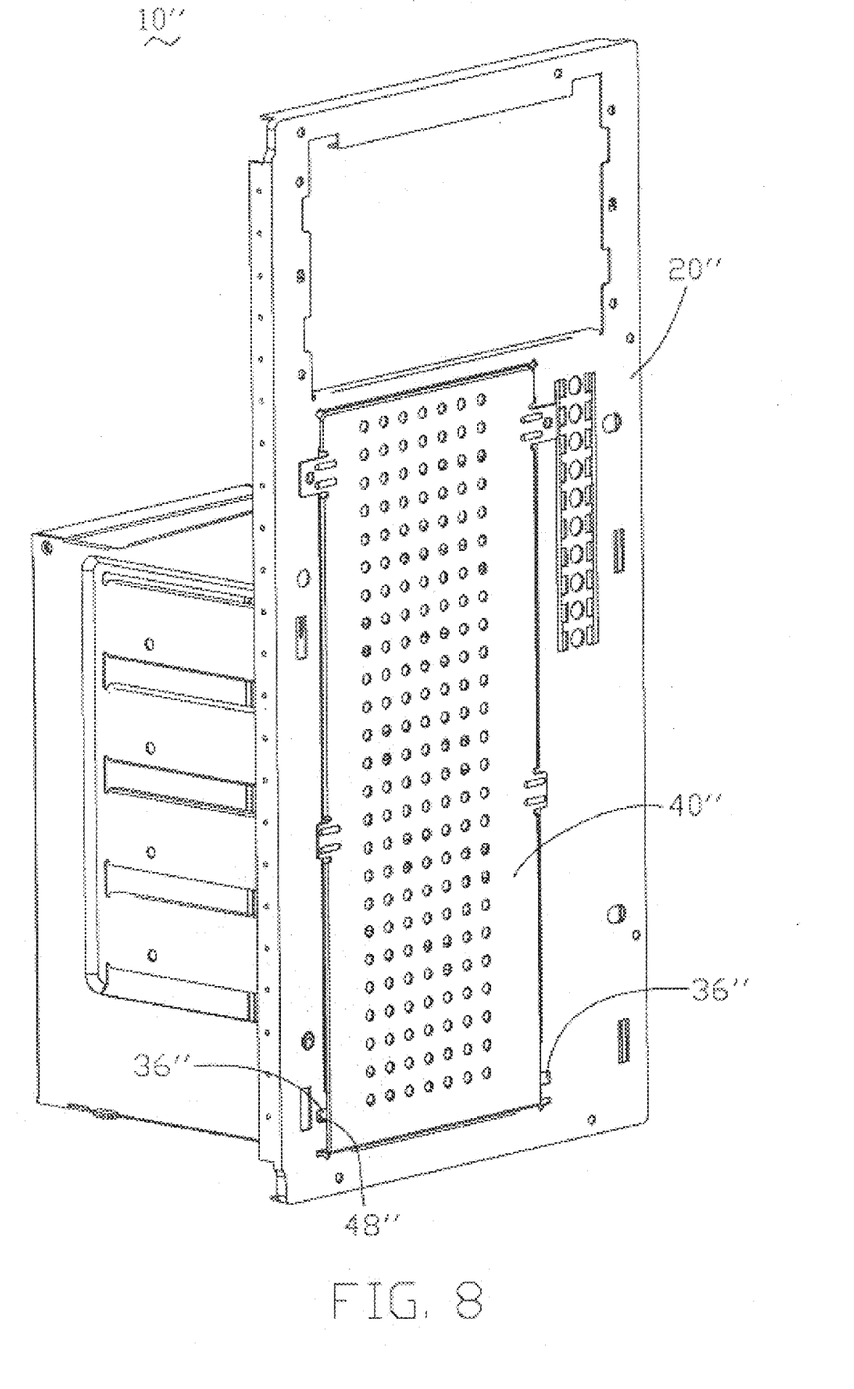
FIG. 8 is an assembled view of FIG. 7.

FIGS. 7 and 8 show a computer enclosure 10" in accordance with a further alternative embodiment of the present invention. A bracket 40" of the enclosure 10" is similar to the bracket 40' of the enclosure 10'. However, a pair of second ears 48" is respectively stamped perpendicularly outwardly from opposite side walls 44" of the bracket 40", in place of the second ears 48' of the bracket 40'. First pivot holes 28" are defined in opposite vertical flanges 32" of the front panel 20" respectively. A pair of guideways 36" is also defined in the opposite vertical flanges 32" respectively, in communication with the corresponding first pivot holes 28". In assembly, the second ears 48" are slid through the guideways 36" into the first pivot holes 28". For brevity, further detailed description of the enclosure 10" is omitted herefrom. Instead, reference is made to the detailed descriptions of the enclosures 10 and 10', with due alteration of details.

The enclosures 10', 10" of the present invention have the same advantages as those described above in relation to the enclosure 10.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. An computer enclosure comprising:
   a front panel defining an opening, a pair of first ears respectively extending at opposite sides of the opening; and
   a pivotable bracket rotatable through the opening of the front panel and pivotally attached to the front panel, the bracket comprising a front wall and a pair of side walls perpendicular to the front wall, and a pair of second ears respectively extending from the front wall and being pivotally attached to the first ears of the front panel, at least one locating tab extending from the front wall and being securable to the front panel.

2. The computer enclosure as recited in claim 1, wherein each first ear defines a first pivot hole therein, each second ear defines a second pivot hole therein, and a pivot is inserted into the first and second pivot holes, thereby pivotally attaching the bracket to the front panel.

3. The computer enclosure as recited in claim 1, wherein each first ear defines a first pivot hole and a guideway therein, and each second ear forms a latch thereon for sliding into the corresponding pivot hole through the corresponding guideway, thereby pivotally attaching the bracket to the front panel.

4. The computer enclosure as recited in claim 1, wherein at least one screw hole is defined beside the opening, and wherein a through hole is defined in the bracket corresponding to the at least one screw hole, a screw inserted into the screw hole and the through hole for securing the bracket to the front panel.

5. The computer enclosure as recited in claim 1, wherein the first ears of the front panel are perpendicular to the front panel.

6. The computer enclosure as recited in claim 1, wherein the second ears of the bracket are perpendicular to the front wall of the bracket, and each second ear is coplanar with the corresponding side wall of the bracket.

7. The computer enclosure as recited in claim 1, wherein a pair of reinforcing tabs extends coplanarly from opposite sides of a central portion of the front wall of the bracket, for enhancing securing of the bracket to the front panel.

8. The computer enclosure as recited in claim 1, wherein the side walls form a plurality of supporting portions thereon, for supporting disk drives.

9. The computer enclosure as recited in claim 1, wherein a plurality of flanges extends perpendicularly inwardly from a bottom edge of the front panel adjacent the opening and from side edges of the front panel adjacent the opening, for enhancing contact with the bracket.

10. The computer enclosure as recited in claim 1, wherein a beam is secured between the side walls of the bracket, to reinforce the bracket.

11. A computer enclosure comprising:

a front panel defining an opening, and a pair of pivot holes therein; and a pivotable bracket rotatable through the opening of the front panel, the bracket comprising a front wall and a pair of side walls perpendicular to the front wall, wherein a pair of ears respectively extends from the side walls, each ear being received in the corresponding pivot hole of the front panel thereby pivotally attaching the bracket to the front panel, and wherein at least one locating tab extends from the front wall and is secured to the front panel.

12. The computer enclosure as recited in claim 11, wherein a pair of guideways is defined in the front panel respectively in communication with the corresponding pivot holes of the front panel, for guiding the ears of the bracket into the pivot holes.

13. The computer enclosure as recited in claim 11, wherein at least one screw hole is defined beside the opening, and wherein a through hole is defined in the bracket, a screw is inserted into the screw hole and the through hole, for securing the bracket to the front panel.

14. The computer enclosure as recited in claim 11, wherein the ears of the bracket are perpendicular to the side walls of the bracket.

* * * * *